United States Patent
Shinomiya et al.

(10) Patent No.: US 10,851,472 B2
(45) Date of Patent: Dec. 1, 2020

(54) METHOD OF PRODUCING APATITE CRYSTAL, AND APATITE CRYSTAL

(71) Applicants: Koito Manufacturing Co., Ltd., Tokyo (JP); Kochi University, Kochi (JP)

(72) Inventors: Yu Shinomiya, Shizuoka (JP); Kazumichi Yanagisawa, Kochi (JP); Masoud Sakaki, Kochi (JP)

(73) Assignee: KOITO MANUFACTURING CO., LTD., Kochi (JP)

(*) Notice: Subject to any disclaimer, the term of this patent is extended or adjusted under 35 U.S.C. 154(b) by 0 days.

(21) Appl. No.: 15/622,106

(22) Filed: Jun. 14, 2017

(65) Prior Publication Data

US 2017/0362737 A1 Dec. 21, 2017

(30) Foreign Application Priority Data

Jun. 15, 2016 (JP) ................. 2016-119079

(51) Int. Cl.
| | | |
|---|---|---|
| *C01B 25/455* | (2006.01) | |
| *C30B 29/12* | (2006.01) | |
| *C30B 15/36* | (2006.01) | |
| *C30B 9/06* | (2006.01) | |
| *C30B 29/14* | (2006.01) | |

(52) U.S. Cl.
CPC ............ *C30B 29/12* (2013.01); *C01B 25/455* (2013.01); *C30B 9/06* (2013.01); *C30B 15/36* (2013.01); *C30B 29/14* (2013.01)

(58) Field of Classification Search
CPC .................................................. C01B 25/455
See application file for complete search history.

(56) References Cited

U.S. PATENT DOCUMENTS

2015/0182876 A1* 7/2015 Enomoto ............... A61K 47/02
424/443

FOREIGN PATENT DOCUMENTS

| CN | 104220649 A | 12/2014 | |
|---|---|---|---|
| CN | 104640623 A | 5/2015 | |
| CN | 104787994 A | 7/2015 | |
| CN | 104861740 A | 8/2015 | |
| CN | 105358479 A | 2/2016 | |
| EP | 2837715 A1 | 2/2015 | |
| WO | 2013/153749 A1 | 10/2013 | |
| WO | WO-2014045534 A1 * | 3/2014 | ............. A61K 47/02 |

OTHER PUBLICATIONS

Official Action on corresponding DE patent application No. 10 2017 112 937.5, dated Jul. 4, 2019.
(Continued)

*Primary Examiner* — Ngoc-Yen Nguyen

(57) ABSTRACT

A method of producing an apatite crystal includes the steps of preparing an apatite single crystal expressed by the general formula $M^2_5(PO_4)_3X$ ($M^2$ being at least atomic element selected from the group consisting of divalent alkaline-earth metals and Eu, and X is at least one atomic selected from the group consisting of halogens); placing the apatite single crystal into a space controllable to a predetermined atmosphere; supplying water vapor into the space; and heating such that the atmosphere in the space is within a 1000° C. to 1400° C. range.

2 Claims, 8 Drawing Sheets

(56) References Cited

OTHER PUBLICATIONS

Official Action on corresponding CN patent application No. 201710451939.3, dated Jul. 19, 2019.
English translation of Abstract of CN105358479A, Feb. 24, 2016.
English translation of Abstract of CN104640623A, May 20, 2015.
English translation of Abstract of CN104220649, Dec. 17, 2014.
English translation of Abstract of CN104787994A, Jul. 22, 2015.
English translation of Abstract of CN104861740A, Aug. 26, 2015.
Official Action on corresponding JP patent application No. 2016-119079, dated Feb. 12, 2020.
Official Action on corresponding CN patent application No. 201710451939.3, dated Mar. 16, 2020.
Official Action on corresponding CN patent application No, 201710451939,3, dated Aug. 14, 2020.

* cited by examiner

METHOD OF PRODUCING APATITE CRYSTAL, AND APATITE CRYSTAL

CROSS-REFERENCE TO RELATED APPLICATIONS

This application is based upon and claims the benefit of priority from the prior Japanese Patent Application No. 2016-119079, filed on Jun. 15, 2016, the entire contents of which are incorporated herein by reference.

BACKGROUND OF THE INVENTION

1. Field of the Invention

The present invention relates to crystalline apatite, finding application as a functional material in a wide range of fields.

2. Description of the Related Art

The development of apatite-based materials as phosphors and biofunctional materials has been advancing in recent years. As apatite-based crystals of this sort, tubular apatite single crystals of hexagonal outer form have been devised (International Publication No. 2013/153749).

Apatite-based materials are suitable for a variety of uses, wherein there is still room for improvement in their forms and components suiting those uses, and in the method of their production.

SUMMARY OF THE INVENTION

An object of the present invention, brought about taking such circumstances into consideration, is to make available technology pertaining to methods of manufacturing novel apatite crystal.

A method of producing an apatite crystal according to an aspect of the present invention includes the steps of preparing an apatite single crystal expressed by the general formula $M^2_5(PO_4)_3X$ ($M^2$ is at least one atomic element selected from the group consisting of divalent alkaline-earth metals and Eu, and X is at least one atomic element selected from the group consisting of halogens); placing the apatite single crystal into a space controllable to a predetermined atmosphere; supplying water vapor into the space; and heating such that the atmosphere in the space is within a 1000° C. to 1400° C. range.

BRIEF DESCRIPTION OF THE DRAWINGS

Embodiments will now be described, byway of example only, with reference to the accompanying drawings that are meant to be exemplary, not limiting, and wherein like elements are numbered alike in several figures, in which.

DETAILED DESCRIPTION OF THE INVENTION

Figure 1:
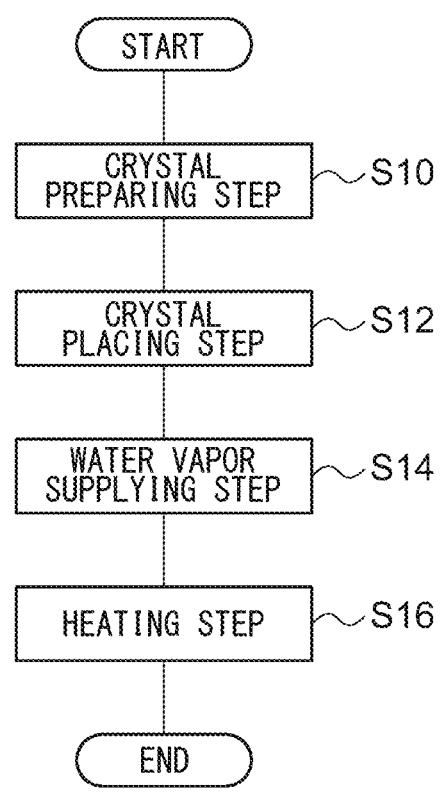
FIG. 1 is a flowchart illustrating an overview of a method of producing hydroxyapatite with the use of halogenated apatite.

The invention will now be described by reference to the preferred embodiments. This does not intend to limit the scope of the present invention, but to exemplify the invention.

A method of producing an apatite crystal according to the present embodiment includes the steps of preparing an apatite single crystal expressed by the general formula $M^2_5(PO_4)_3X$ ($M^2$ is at least one atomic element selected from the group consisting of divalent alkaline-earth metals and Eu, and X is at least one atomic element selected from the group consisting of halogens); placing the apatite single crystal into a space controllable to a predetermined atmosphere; supplying water vapor into the space; and heating such that the atmosphere in the space is within a 1000° C. to 1400° C. range.

When the halogen element X in $M^2_5(PO_4)_3X$ is replaced with a hydroxyl group to produce hydroxyapatite, a by-product such as $M^2_3(PO_4)_2$ may deposit. Such a by-product can result in a substance that interferes with the purpose depending on the intended use of the apatite. According to the above aspect, generation of the by-product can be suppressed, and a desired apatite crystal can be produced.

Another aspect of the present embodiment also provides a production method. This method includes the steps of preparing a tubular apatite single crystal expressed by the general formula $M^2_5(PO_4)_3X$ ($M^2$ is at least one atomic element selected from the group consisting of divalent alkaline-earth metals and Eu, and X is at least one atomic element selected from the group consisting of halogens); placing the apatite single crystal into a space controllable to a predetermined atmosphere; supplying water vapor into the space; and heating such that the atmosphere in the space is at a temperature at which a portion of the halogen atoms contained in the apatite single crystal can be replaceable with hydroxyl groups.

According to this aspect, generation of a by-product can be suppressed, and a desired tubular apatite crystal can be produced.

In the step of heating, the heating may be such that the atmosphere in the space is within a 1000° C. to 1400° C. range. This makes it possible to produce hydroxyapatite efficiently while suppressing the generation of a by-product.

The step of heating may be carried out within a 2 to 360 hour range. This makes it possible to produce hydroxyapatite efficiently while suppressing the generation of a by-product.

The step of heating may be carried out under normal pressure. This allows for the use of a simple apparatus and makes it possible to reduce the production cost.

Yet another aspect of the present embodiment provides an apatite crystal. This apatite crystal includes a single crystal of halogenated apatite expressed by the general formula $M^2{}_5(PO_4)_3X$ ($M^2$ is at least one atomic element selected from the group consisting of divalent alkaline-earth metals and Eu, and X is at least one atomic element selected from the group consisting of halogens); and hydroxyapatite formed on the single crystal.

According to this aspect, the surface of the apatite crystal is formed of hydroxyapatite, and the apatite crystal can thus be used as a culture medium for cells.

The hydroxyapatite may be a compound in which the halogen atoms in the halogenated apatite are replaced with hydroxyl groups.

The single crystal may be tubular, and the single crystal in its outer form may be hexagonal prismatic.

It is to be noted that any optional combinations of the above constituent elements and an embodiment obtained by converting what is expressed by the present invention into a method, an apparatus, a system, and so on are also effective as an embodiment of the present invention.

Hereinafter, embodiments for implementing the present invention will be descried in detail with reference to the drawings and so on. In the description of the drawings, identical elements are given identical reference characters, and duplicate descriptions thereof will be omitted, as appropriate.

An apatite crystal according to an aspect of the present embodiment is a single crystal of halogenated apatite expressed by the general formula $M^2{}_5(PO_4)_3X$ ($M^2$ is at least one type of element selected from the group consisting of divalent alkaline-earth metals and Eu, and X is at least one type of element selected from the group consisting of halogen elements). The alkaline-earth metals are, for example, Ca, Sr, Ba, Ra, Mg, and Be. The halogen elements are, for example, F, Cl, Br, and I.

FIG. 1 is a flowchart illustrating an overview of a method of producing hydroxyapatite with the use of halogenated apatite. A method of producing an apatite crystal according to the present embodiment includes the steps of preparing an apatite single crystal expressed by the general formula $M^2{}_5(PO_4)_3X$ ($M^2$ is at least one type of element selected from the group consisting of divalent alkaline-earth metals and Eu, and X is at least one type of element selected from the group consisting of halogen elements) (S10); placing the apatite single crystal into a space that can be controlled to a predetermined atmosphere (S12); supplying a water vapor into the space (S14); and heating the space such that a temperature of the atmosphere in the space falls within a predetermined range (S16).

Hereinafter, methods of producing a tubular single crystal of halogenated apatite will be described with reference to the working examples. Working examples 1 to 7 each provide a method of synthesizing a chlorapatite single crystal, which is a type of halogenated apatite. Exemplary synthesizing methods include a flux method, a coprecipitation method, and a sol-gel method.

Method of Producing Halogenated Apatite Single Crystal

Working Example 1: Flux Method

First, $CaHPO_4$, $CaCO_3$, and $CaCl_2$ were weighted so that the mole ratio of Ca:P:Cl was 5:3:1 and were mixed to uniformity. Then, NaCl was added thereto so that the concentration of chlorapatite was 0.15 mol %, and the temperature of the mixture was raised to 800-1100° C. at a heating rate of 100-500° C./h in a platinum crucible. The mixture was synthesized for 48 hours at a synthesizing temperature of 800-1100° C., and the temperature of the mixture was then lowered from 800-1100° C. to 500° C. at a cooling rate of 5-300° C./h. Thereafter, the mixture was naturally cooled to a normal temperature. After having been calcinated, the mixture was thoroughly cleansed with warm pure water (approximately 80° C.) to extract a chlorapatite single crystal.

Working Example 2: Flux Method

First, $CaHPO_4$, $CaCO_3$, and $CaCl_2$ were weighted so that the mole ratio of Ca:P:Cl was 5:3:1 and were mixed to uniformity. Then, a large amount of $CaCl_2$ was added thereto, and the temperature of the mixture was raised to 800-1100° C. at a heating rate of 100-500° C./h in a platinum crucible. The mixture was synthesized for 48 hours at a synthesizing temperature of 800-1100° C., and the temperature of the mixture was then lowered from 800-1100° C. to 500° C. at a cooling rate of 5-300° C./h. Thereafter, the mixture was naturally cooled to a normal temperature. After having been calcinated, the mixture was thoroughly cleansed with warm pure water (approximately 80° C.) to extract a chlorapatite single crystal.

Working Example 3: Flux Method

First, $CaHPO_4$, $CaCO_3$, $SrCO_3$, $CaCl_2$, and $SrCl_2$ were weighted so that the mole ratio of Ca+Sr:P:Cl was 5:3:1 and were mixed to uniformity. Then, $SrCl_2$ was added thereto so that the concentration of chlorapatite was 0.15 mol %, and the temperature of the mixture was raised to 800-1100° C. at a heating rate of 100-500° C./h in a platinum crucible. The mixture was synthesized for 48 hours at a synthesizing temperature of 800-1100° C., and the temperature of the mixture was then lowered from 800-1100° C. to 500° C. at a cooling rate of 5-300° C./h. Thereafter, the mixture was naturally cooled to a normal temperature. After having been calcinated, the mixture was thoroughly cleansed with warm pure water (approximately 80° C.) to extract a chlorapatite single crystal.

Working Example 4: Flux Method

First, $CaHPO_4$, $CaCO_3$, $MgCO_3$, $CaCl_2$, and $MgCl_2$ were weighted so that the mole ratio of Ca+Mg:P:Cl was 5:3:1 and were mixed to uniformity. Then, $MgCl_2$ was added thereto so that the concentration of chlorapatite was 0.15 mol %, and the temperature of the mixture was raised to 800-1100° C. at a heating rate of 100-500° C./h in a platinum crucible. The mixture was synthesized for 48 hours at a synthesizing temperature of 800-1100° C., and the temperature of the mixture was then lowered from 800-1100° C. to 500° C. at a cooling rate of 5-300° C./h. Thereafter, the mixture was naturally cooled to a normal temperature. After having been calcinated, the mixture was thoroughly cleansed with warm pure water (approximately 80° C.) to extract a chlorapatite single crystal.

Working Example 5: Coprecipitation Method

First, calcium nitrate and calcium chloride were dissolved in pure water, and phosphoric acid was added dropwise to the solution to adjust pH to 5-9, thereby causing precipitation (seed crystal). The seed crystal prepared through this coprecipitation method was subjected to seed crystal growth by the Czochralski process. In a $CaCsl_2$-$Ca_2ClPO_4$ binary system phase diagram, one with a $Ca_2ClPO_4$ concentration of 15 mol % was heated to 1200° C., and the seed crystal was soaked in a high-temperature solution. While the seed crystal was gradually cooled from 1200° C. to 1050° C., the crystal was pulled up to obtain a chlorapatite single crystal.

Working Example 6: Sol-Gel Method

First, calcium nitrate was dissolved in distilled water, and phosphoric acid ethoxide was added thereto (the total molarity of calcium and phosphorus: 0.05 mol/L) and stirred. Then, concentrated hydrochloric acid (1 mole of chlorine with respect to 1 mole of calcium) was added. This solution was dried at 60° C. for two hours to remove the distilled water, and a seed crystal was thus obtained. The seed crystal prepared through this sol-gel method was subjected to seed crystal growth by the Czochralski process. In a $CaCl_2$—$Ca_2ClPO_4$ binary system phase diagram, one with a $Ca_2ClPO_4$ concentration of 15 mol % was heated to 1200° C., and the seed crystal was soaked in a high-temperature solution. While the seed crystal was gradually cooled from 1200° C. to 1050° C., the crystal was pulled up to obtain a chlorapatite single crystal.

Working Example 7: Sol-Gel Method

First, calcium ethoxide was dissolved in distilled water, and phosphoric acid was added thereto (the total molarity of calcium and phosphorus: 0.05 mol/L) and stirred. Then, concentrated hydrochloric acid was added. This solution was dried at 60° C. for two hours to remove the distilled water, and a seed crystal was thus obtained. The seed crystal prepared through this sol-gel method was subjected to seed crystal growth by the Czochralski process. In a $CaCl_2$—$Ca_2ClPO_4$ binary system phase diagram, one with a $Ca_2ClPO_4$ concentration of 15 mol % was heated to 1200° C., and the seed crystal was soaked in a high-temperature solution. While the seed crystal was gradually cooled from 1200° C. to 1050° C., the crystal was pulled up to obtain a chlorapatite single crystal.

Composition

Figure 2:
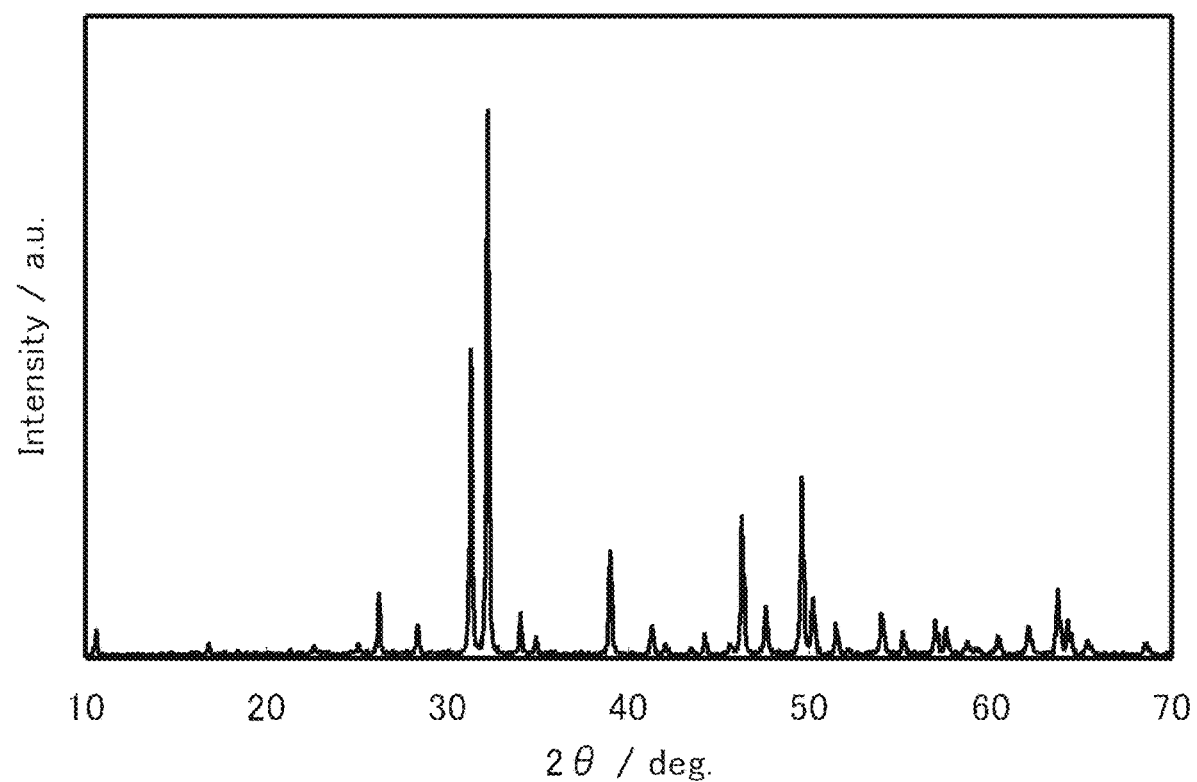
FIG. 2 illustrates an example of an X-ray diffraction pattern of a crystal produced through a method of a working example.

Next, the compositions of the chlorapatite crystals produced through the methods of the working examples were examined. FIG. 2 illustrates an example of an X-ray diffraction pattern of a crystal produced through a method of a working example. As illustrated in FIG. 2, the crystal is a single layer of the chlorapatite crystal $Ca_5(PO_4)_3Cl$.

Constituent

Next, the elements of the chlorapatite tube single crystal were analyzed. The result indicates that the crystal contains Ca at 39.10 mass %, P at 18.00 mass %, and Cl at 5.30 mass %.

Shape

Figure 3:
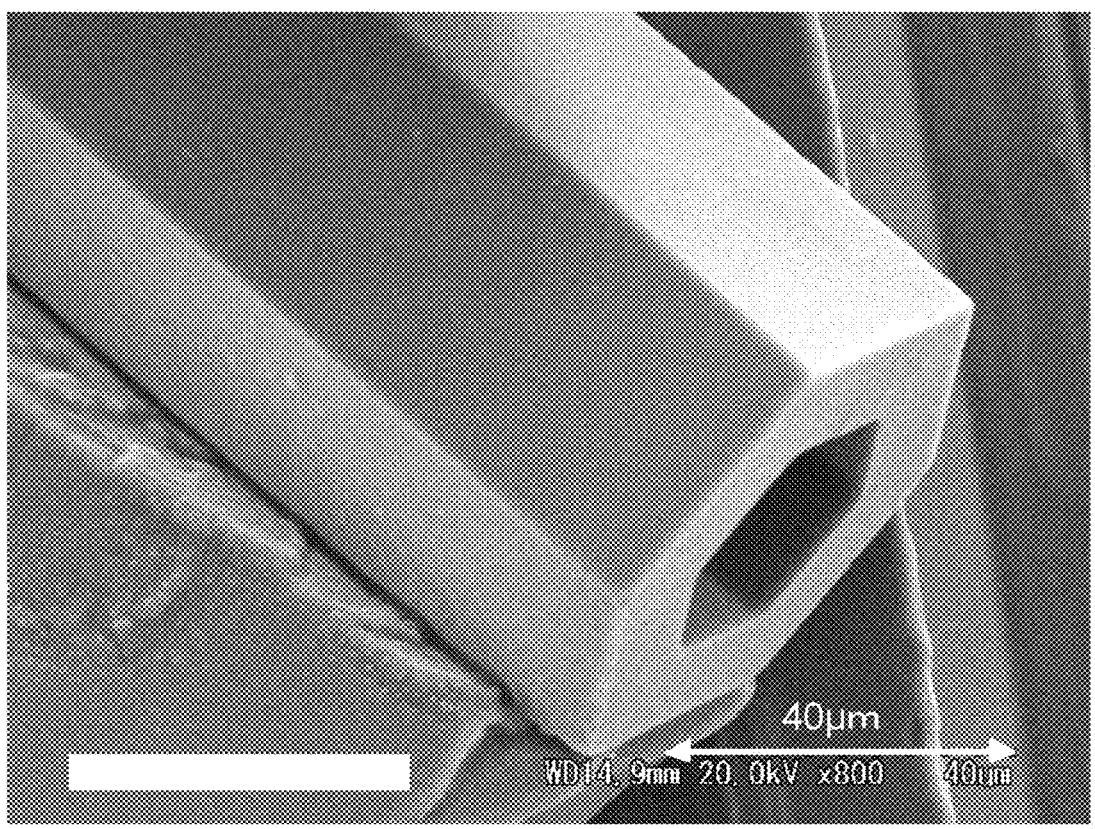
FIG. 3 is a photograph illustrating an example of a chlorapatite tube single crystal observed with an SEM.

Next, the shape of the chlorapatite tube single crystal was observed with a scanning electron microscope (SEM). FIG. 3 is a photograph illustrating an example of the chlorapatite tube single crystal observed by the SEM. As illustrated in FIG. 3, the apatite single crystal according to the present embodiment is tubular and has an outer shape of a hexagonal prism. In addition, the shape of an opening formed in the upper surface or the lower surface of the hexagonal prism is hexagonal. Thus, the outer wall of the tube has a substantially uniform thickness.

The observation with the SEM has revealed that such tubular single crystals are present in a variety of sizes and in a variety of modes. For example, the inner diameter of the opening in the tubular single crystal is approximately 10 nm to 60 μm. The diameter of the tubular single crystal is approximately 20 nm to 100 μm. The tubular single crystal has a length of approximately 50 nm to 4 mm in the lengthwise direction. The transmittance of the tubular single crystal with respect to visible light is no less than 65%.

Halogenated apatite crystals, exemplified by the chlorapatite single crystals obtained in the working examples 1 to 7, are being employed for a variety of uses including the use as a biomaterial. Furthermore, the diligent examinations of the inventor of the present application have led to the possible applications of halogenated apatite crystals in a greater variety of uses by replacing the halogen group in the apatite crystals with a hydroxyl group.

For example, hydroxyapatite has high affinity with cells and can be used to culture cells. However, when the halogen group in an apatite crystal is replaced with a hydroxyl group, TCP ($Ca_3(PO_4)_2$) may deposit as a by-product. Although this TCP is a material useful in bone formation, when TCP is dissolved in water, pH changes to cause the water to be acidified, and thus TCP is not a preferable material for cells. Accordingly, when hydroxyapatite is used as a cell culture or the like, it is important to remove TCP from hydroxyapatite or to suppress the generation of TCP when producing hydroxyapatite.

Figure 4:
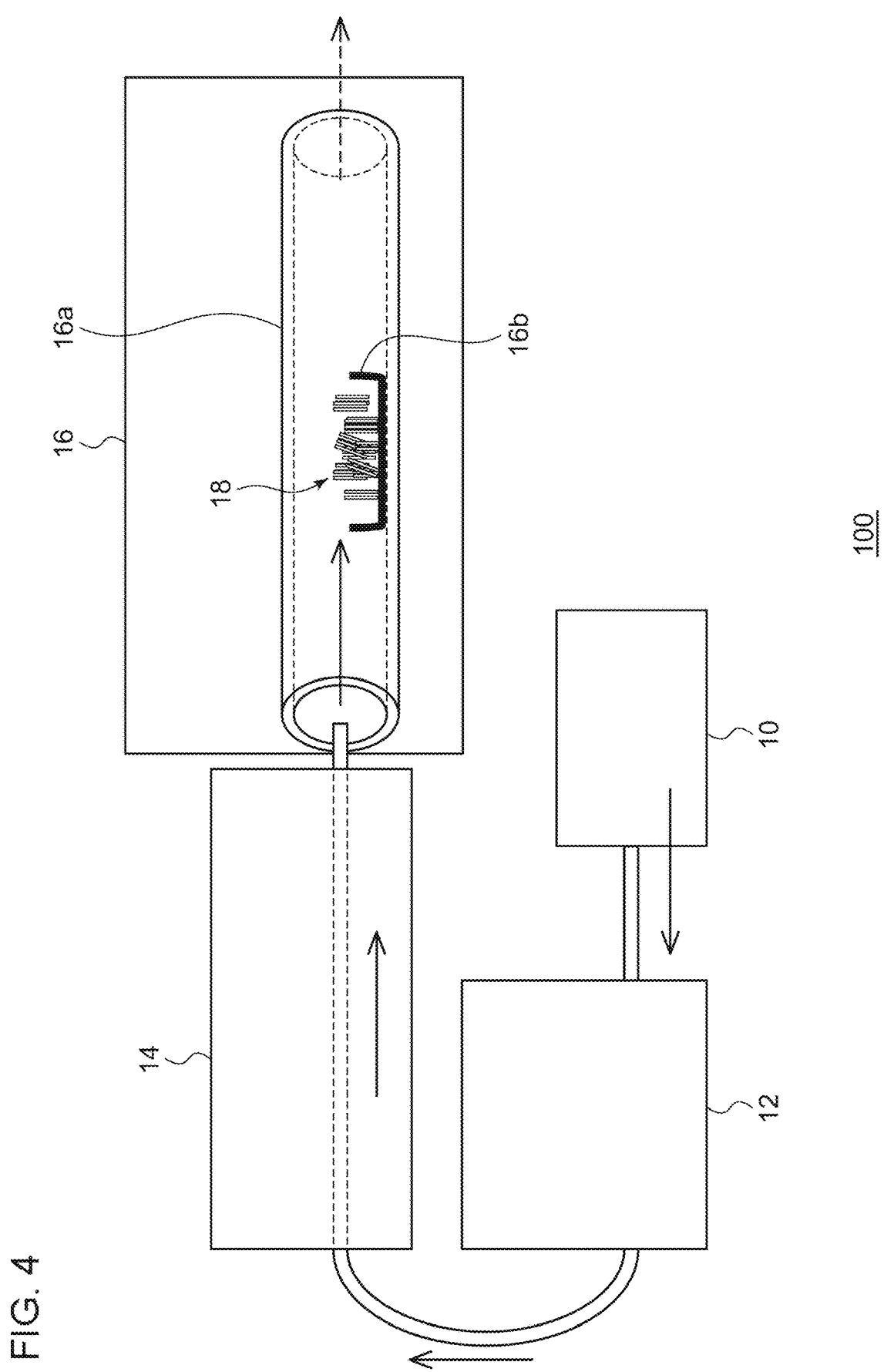
FIG. 4 is a schematic diagram illustrating the overall configuration of an apparatus for producing hydroxyapatite according to an embodiment.

FIG. 4 is a schematic diagram illustrating the overall configuration of an apparatus for producing hydroxyapatite according to the present embodiment. As illustrated in FIG. 4, a production apparatus 100 includes a receptacle 10 in which distilled water is stored, a pump 12 that feeds the water, a heater 14 that heats the water into a water vapor, and a tubular furnace 16 provided with a heating mechanism for converting a halogenated apatite crystal into hydroxyapatite.

The pump 12 pressure-feeds the distilled water stored in the receptacle 10 to the heater 14 at the rate of 5 ml/min. The amount by which the distilled water is fed is selected, as appropriate, in accordance with the kind and the amount of an apatite crystal to be produced, the shape of the tubular furnace 16 described later, or the like and may be selected, for example, from the range of 1-1000 ml/min.

The heater 14 heats the fed distilled water to approximately 300° C. to produce a water vapor. The heating temperature is selected, as appropriate, in accordance with the kind and the amount of an apatite crystal to be produced, the shape of the tubular furnace 16 described later, or the like and may be selected from the range of 100-500° C. and more preferably from the range of 200-400° C.

The tubular furnace 16 includes a pipe 16a provided thereinside with a tray 16b on which an apatite crystal is placed, and the chlorapatite single crystals 18 produced through the methods according to the working examples 1 to 7 described above are placed on the tray 16b. The space inside the pipe 16a can be controlled to a predetermined atmosphere. The tubular furnace 16 according to the present embodiment is configured such that the atmosphere inside the pipe 16a is stabilized at a temperature within a predetermined temperature range. As a heated water vapor is supplied into the pipe 16a in this state, a hydroxyapatite crystal is produced.

The present inventors have examined the presence of hydroxylation of chlorapatite and the present of generation of TCP, which is a by-product, while changing, as appropriate, the heating temperature of the tubular furnace 16 and the reaction time with the use of the production apparatus 100.

The experimental conditions are as follows: the processing temperature of the tubular furnace 16 was varied among 1000° C., 1100° C., 1200° C., 1300° C., and 1400° C.; the processing time was varied among 2 hrs, 6 hrs, 12 hrs, 24 hrs, 48 hrs, 120 hrs, and 360 hrs. Then, the reaction product was identified through the infrared spectrum analysis and the X-ray diffractometry.

In the infrared spectrum analysis, a sample of the chlorapatite single crystal processed in each of the experimental conditions was ground, a prescribed amount thereof was mixed into KBr to produce a tablet, and the presence and the size of the hydroxyl (OH) group peak around 3600 cm$^{-1}$ were determined.

Figure 5:
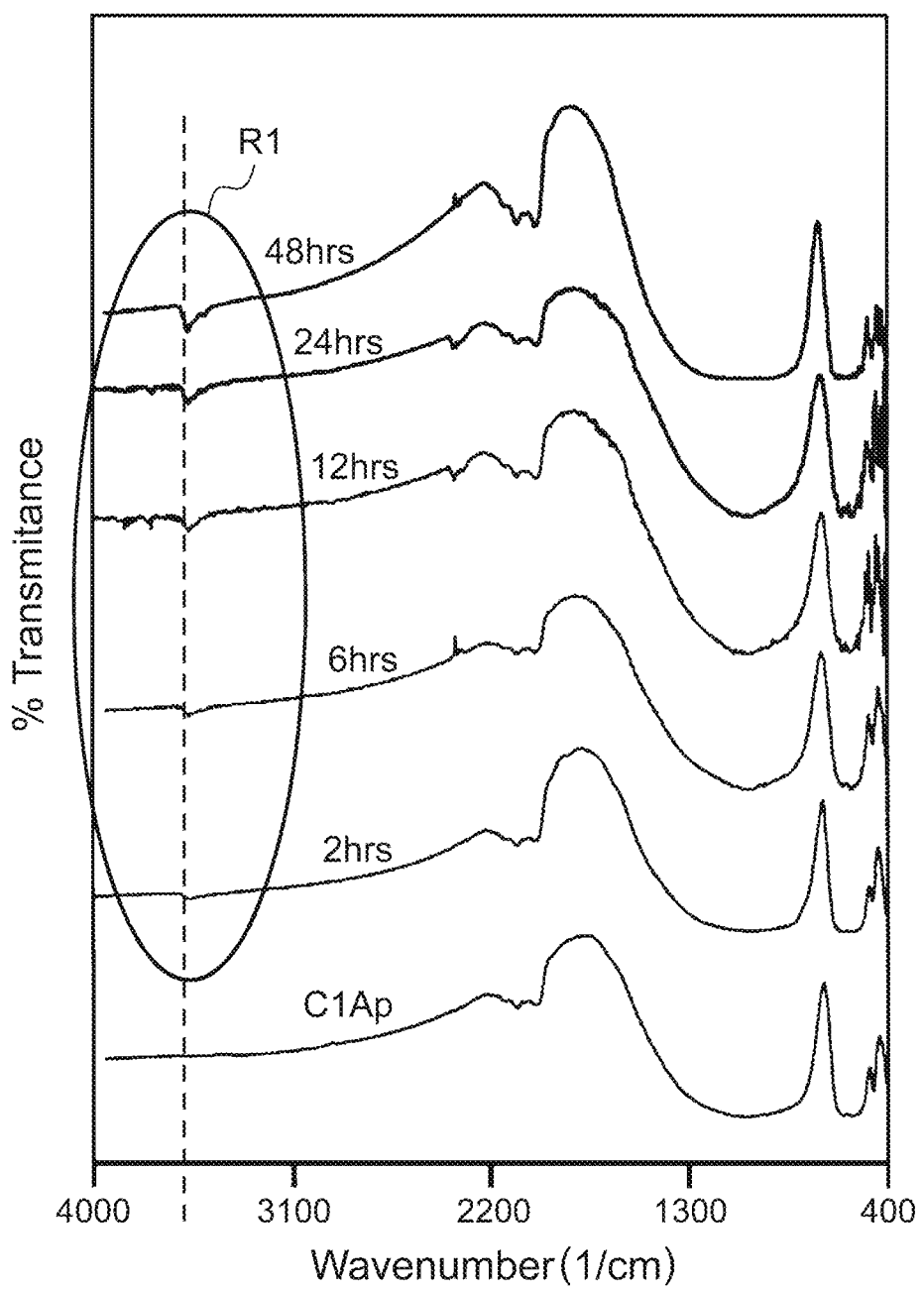
FIG. 5 illustrates infrared spectra of apatite crystals processed at a processing temperature of 1200° C. (for processing times of 2 hrs, 6 hrs, 12 hrs, 24 hrs, and 48 hrs)

FIG. 5 illustrates infrared spectra of the apatite crystals processed at a processing temperature of 1200° C. (for respective processing times of 2 hrs, 6 hrs, 12 hrs, 24 hrs, and 48 hrs). As indicated by the region R1 in FIG. 5, the hydroxyl (OH) group peak around 3600 cm$^{-1}$ was observed at each of the processing times.

Figure 6:
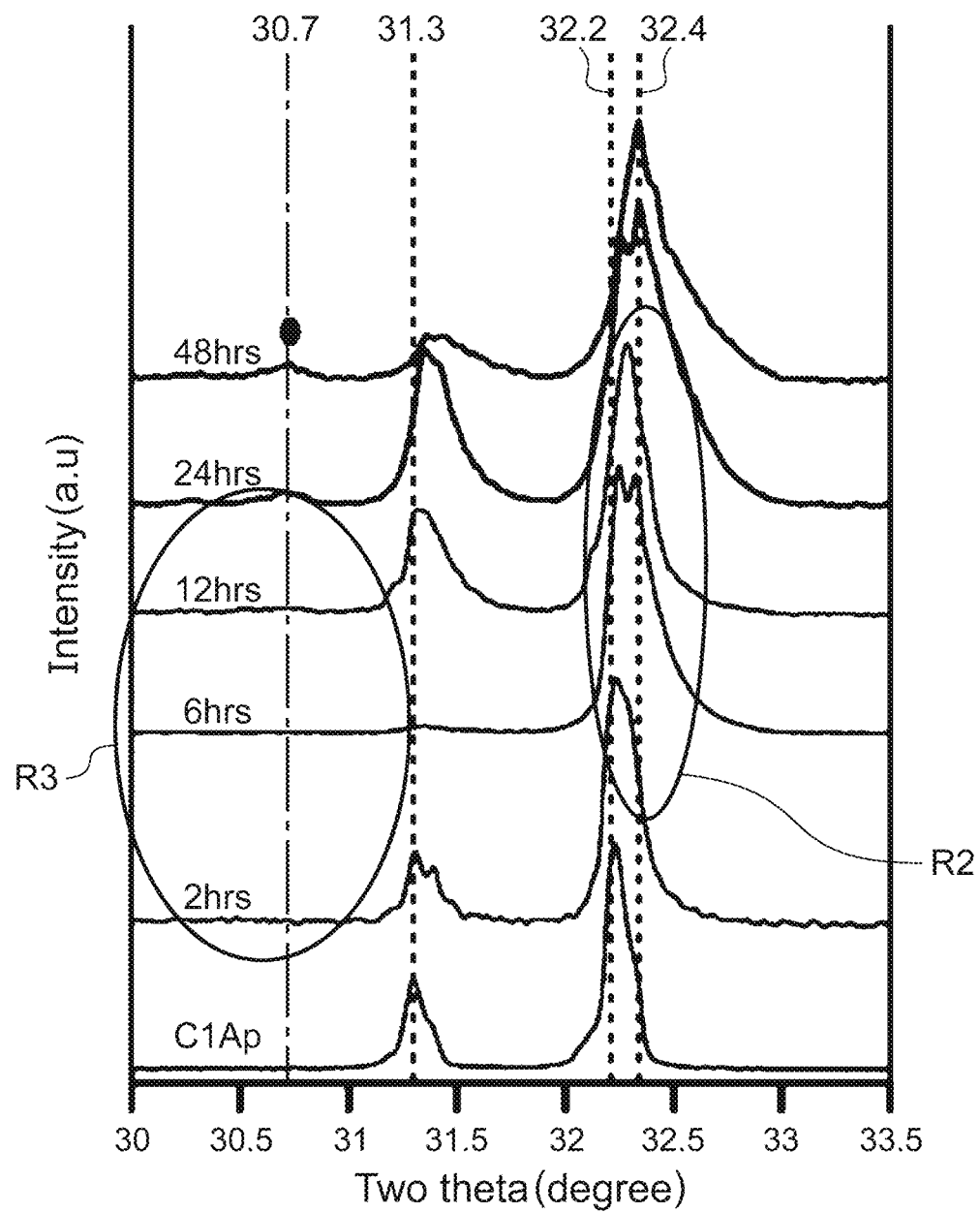
FIG. 6 illustrates X-ray diffraction patterns of apatite crystals processed at a processing temperature of 1200° C. (for processing times of 2 hrs, 6 hrs, 12 hrs, 24 hrs, and 48 hrs)

FIG. 6 illustrates X-ray diffraction patterns of the apatite crystals processed at a processing temperature of 1200° C. (for respective processing times of 2 hrs, 6 hrs, 12 hrs, 24 hrs, and 48 hrs). As indicated by the region R2 in FIG. 6, the peak at 32.2° indicating the presence of chlorapatite shifts toward the peak at 32.4° indicating the presence of hydroxyapatite as the processing time increases. In other words, it can be seen that the halogen group in chlorapatite is replaced with a hydroxyl group as the processing time increases and the generation of hydroxyapatite increases.

The peaks at 30.7° indicating the generation of TCP is hardly observed until the processing time exceeds 24 hours (refer to the region R3). Meanwhile, the peak at 30.7° is observed when the processing time is 48 hours.

In this manner, at the processing temperature of 1200° C., generation of hydroxyapatite is observed when the processing time is no less than 2 hours, and TCP is hardly generated when the processing time is no greater than 24 hours.

Experiments similar to the above were carried out at respective processing temperatures of 1000° C., 1100° C., 1300° C., and 1400° C. with the processing time varied, as appropriate. Table 1 summaries the results of the experiments carried out at the respective processing temperatures and with the respective processing times. In the table, the symbol ⊚ indicates the condition in which generation of hydroxyapatite is observed, TCP is hardly generated, and the processing time is relatively short in terms of the productivity. The symbol ○ indicates the condition in which generation of hydroxyapatite is observed and TCP is hardly generated. The symbol Δ indicates the condition in which generation of hydroxyapatite is observed and TCP is also generated to a certain extent. The symbol x indicates the condition in which generation of hydroxyapatite is not observed.

TABLE 1

| PROCESSING TEMPERATURE (° C.) | PROCESSING TIME (h) | | | | | | |
|---|---|---|---|---|---|---|---|
| | 2 | 6 | 12 | 24 | 48 | 120 | 360 |
| 1400 | Δ | Δ | Δ | | | | |
| 1300 | Δ | Δ | Δ | Δ | | | |
| 1200 | ⊚ | ⊚ | ⊚ | ○ | Δ | | |
| 1100 | X | ○ | ○ | ○ | | | |
| 1000 | X | X | X | X | ○ | ○ | ○ |

In this manner, when the halogen element X in $M^2{}_5(PO_4)_3X$ is replaced with a hydroxyl group to produce hydroxyapatite, a by-product such as $M^2{}_3(PO_4)_2$ (e.g., TCP) may deposit. Such a by-product can result in a substance that interferes with the purpose depending on the intended use of the apatite.

Accordingly, in the step of heating in the production method that uses the production apparatus described above, the space is heated such that the temperature of the atmosphere in the space falls within the range from 1000° C. to 1400° C. In the step of heating, the space may be heated such that the temperature of the atmosphere in the space reaches a temperature at which a portion of the halogen element contained in the apatite single crystal can be replaced with a hydroxyl group. In the step of heating, the space is heated for a duration in the range from 2 hours to 360 hours. This makes it possible to produce a tubular hydroxyapatite single crystal efficiently while suppressing the generation of TCP, which is a by-product.

The step of heating carried out in the tubular furnace 16 according to the present embodiment is carried out at a normal pressure. The normal pressure as used herein includes not only an atmospheric pressure but the pressure inside the pipe 16a that is not actively controlled. This renders a complex mechanism such as a pressure control mechanism unnecessary and makes it possible to use a simple apparatus, and the production cost can thus be reduced.

An apatite crystal produced with the production apparatus 100 can be rephrased as an apatite crystal that includes a single crystal of halogenated apatite expressed by the general formula $M^2{}_5(PO_4)_3X$ ($M^2$ is at least one type of element selected from the group consisting of divalent alkaline-earth metals and Eu, and X is at least one type of element selected from the group consisting of halogen elements) and hydroxyapatite formed on the single crystal.

In other words, instead of replacing all the halogen groups in the chlorapatite with a hydroxyl group, the halogen group primarily on the surface region is replaced with a hydroxyl group, and thus a multilayer hydroxyapatite crystal as described above can be obtained. In this manner, the surface of the apatite crystal is formed of hydroxyapatite, and the apatite crystal can thus be used as a culture medium for cells.

Figure 7B:
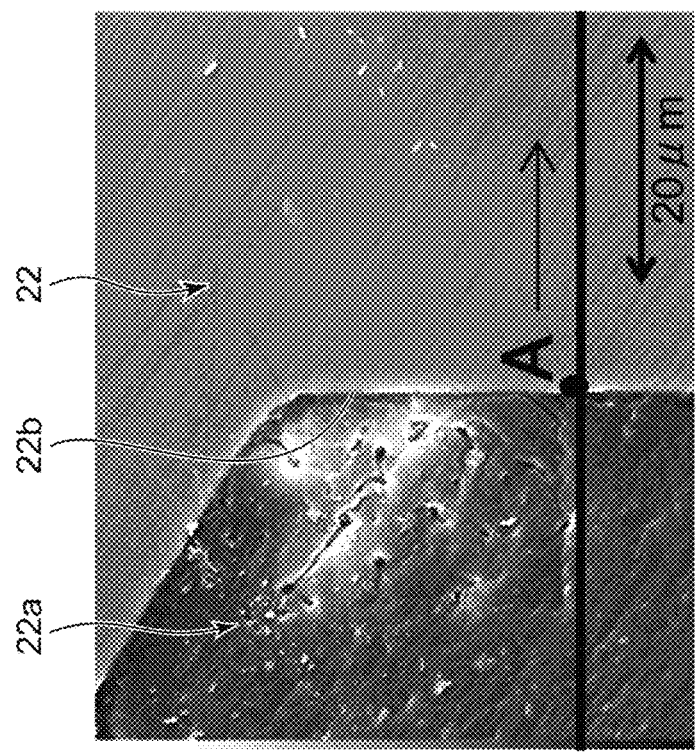
FIG. 7B is an enlarged view of a section of a hydroxylation-processed chlorapatite tube that has been cut along the section and polished.
Figure 7A:
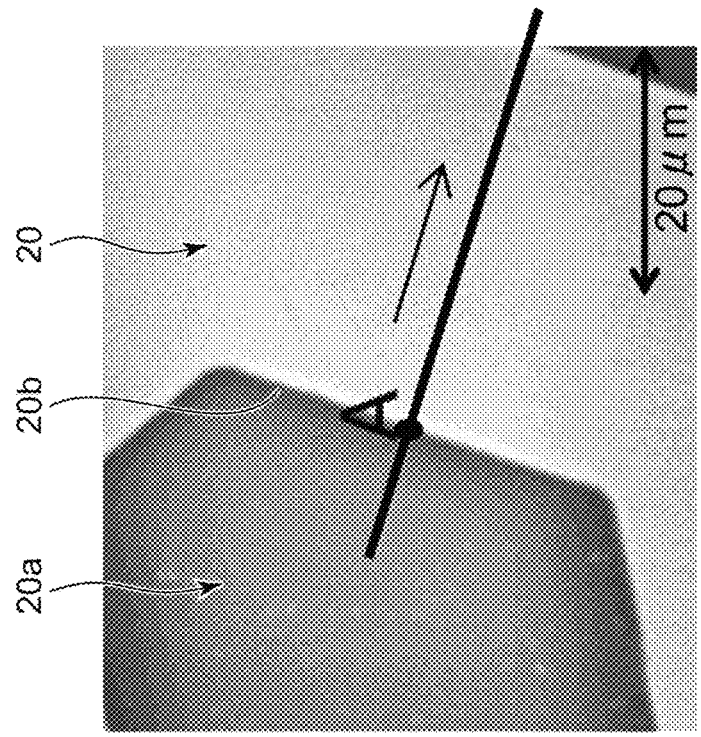
FIG. 7A is an enlarged view of a section of a chlorapatite tube that has been cut along the section and polished.

Next, the experimental results of the hydroxylation process of a chlorapatite tube will be described in detail. FIG. 7A is an enlarged view of a section of a chlorapatite tube that has been cut along the section and polished, and FIG. 7B is an enlarged view of a section of a hydroxylation-processed chlorapatite tube that has been cut along the section and polished. The sections of the samples of these chlorapatite tubes were examined through EDX.

In EDX (energy-dispersive X-ray spectrometry), characteristic X-rays generated through electron beam irradiation are detected and split into a spectrum of energies, and thus a semi-quantitative analysis of an element such as chlorine can be carried out. This time, chlorine was analyzed along the straight line containing the point A illustrated in FIGS. 7A and 7B on the section of the sample along which the sample has been cut and polished.

Figure 8A:
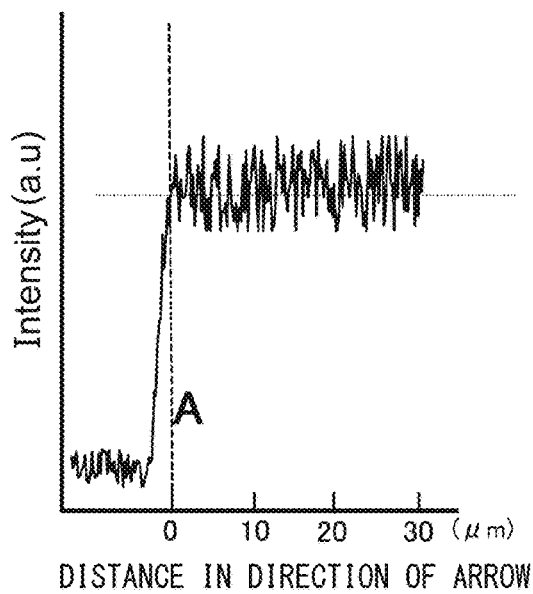
FIG. 8A illustrates the result of EDX performed along a straight line containing a point A on the section of the chlorapatite tube illustrated in FIG. 7A.
Figure 8B:
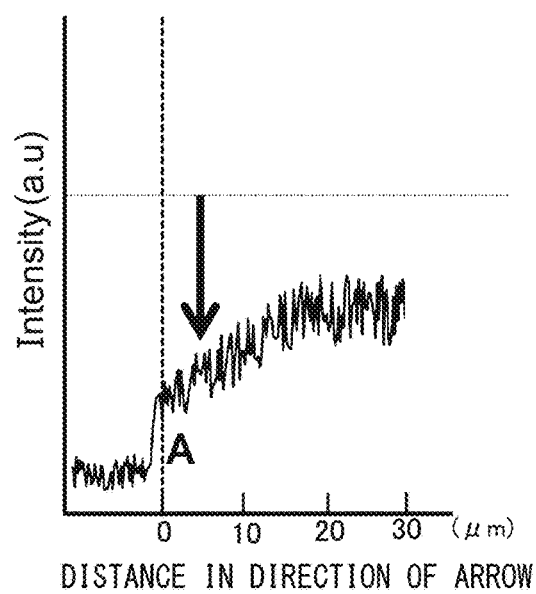
FIG. 8B illustrates the result of EDX performed along a straight line containing a point A on the section of the hydroxylation-processed chlorapatite tube illustrated in FIG. 7B.

FIG. 8A illustrates the result of EDX performed along the straight line containing the point A on the section of the chlorapatite tube illustrated in FIG. 7A. FIG. 8B illustrates the result of EDX performed along the straight line containing the point A on the section of the hydroxylation-processed chlorapatite tube illustrated in FIG. 7B. The graphs illustrated in FIGS. 8A and 8B show the profiles of signals indicating the presence of the chlorine element.

FIG. 8A reveals that a chlorapatite tube 20 that is not hydroxylation-processed contains chlorine in a uniform manner to the point A on an inner peripheral wall 20b of a hexagonal hole 20a. Meanwhile, FIG. 8B reveals that a hydroxylation-processed chlorapatite tube 22 has a smaller amount of chlorine than the chlorapatite tube 20 illustrated in FIG. 8A does in a region including the vicinity of the point A on an inner peripheral wall 22b of a hexagonal hole 22a.

In other words, it can be seen that the chlorine group (Cl) in the vicinity of the inner peripheral wall 22b is replaced with the hydroxyl group (OH) through the hydroxylation process, and thus chlorine in the chlorapatite tube 22 decreases after the process, and the surface of the chlorapatite crystal is formed of hydroxyapatite.

Thus far, the present invention has been described on the basis of the embodiments and the working examples. These embodiments and the working examples are merely illustrative in nature, and it should be appreciated by a person skilled in the art that various modifications can be made to the combinations of the constituent elements and the processing processes of the embodiments and the working examples and that such modifications also fall within the scope of the present invention.

What is claimed is:

1. A method of producing an apatite crystal, the method comprising:
    preparing a tubular apatite single crystal expressed by the general formula $M^2{}_5(PO_4)_3X$, wherein $M^2$ is at least one atomic element selected from the group consisting of divalent alkaline-earth metals and Eu, and X is at least one atomic element selected from the group consisting of halogens;
    placing the apatite single crystal into a space controllable to a predetermined atmosphere;
    supplying water vapor into the space: and
    heating such that the atmosphere in the space is at a temperature at which a portion of the halogen atoms contained in the apatite single crystal are replaced with hydroxyl groups,
    wherein the step of heating is carried out within a 6 to 24 hour range, and
    wherein in the step of heating, the heating is such that the atmosphere in the space is in the range of 1100° C. to 1200° C.

2. The method according to claim 1, wherein the step of heating is carried out under normal pressure.

* * * * *